United States Patent
Kurokawa et al.

(10) Patent No.: US 6,496,963 B2
(45) Date of Patent: Dec. 17, 2002

(54) DELAY ANALYSIS METHOD AND DESIGN ASSIST APPARATUS OF SEMICONDUCTOR CIRCUIT

(75) Inventors: Keiichi Kurokawa, Hyogo (JP); Masahiko Toyonaga, Hyogo (JP); Takuya Yasui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/825,367

(22) Filed: Apr. 4, 2001

(65) Prior Publication Data

US 2002/0010900 A1 Jan. 24, 2002

(30) Foreign Application Priority Data

Apr. 6, 2000 (JP) ........................................ 2000-104681

(51) Int. Cl.[7] ................................................. G06F 9/45
(52) U.S. Cl. .................................. 716/6; 716/2; 716/18
(58) Field of Search ..................................... 716/1–6, 18

(56) References Cited

U.S. PATENT DOCUMENTS 5,889,677 A * 3/1999 Yasuda et al. .................. 716/6
6,240,541 B1 * 5/2001 Yasuda et al. .................. 716/6

FOREIGN PATENT DOCUMENTS

JP 9-54138 2/1997

* cited by examiner

Primary Examiner—Tuan T. Lam
Assistant Examiner—Long Nguyen
(74) Attorney, Agent, or Firm—McDermott, Will & Emery

(57) ABSTRACT

In design of particularly large-scale, complicated semiconductor circuits, a two-dimensional graph is prepared with Si, for example, as one axis and Sj+Wmax+T as the other axis where T is a clock cycle, Wmax is the maximum delay of a circuit portion to be subjected to signal delay analysis, and Si and Sj are clock timings to registers to serve as an input and an output of the circuit portion. The delay analysis results of the circuit portion are plotted on the two-dimensional graph. Also, a two-dimensional graph is prepared with Si, for example, as one axis and Sj−Wmin as the other axis where Wmin is the minimum delay of the circuit portion, and the delay analysis results of the circuit portion are plotted on this two-dimensional graph. Using the resultant two-dimensional graph, therefore, it is possible to provide the cause or an indication for design improvement of the clock circuit, a hold error, and a set-up error.

5 Claims, 2 Drawing Sheets

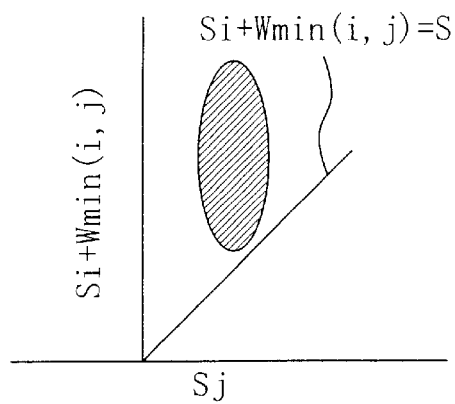
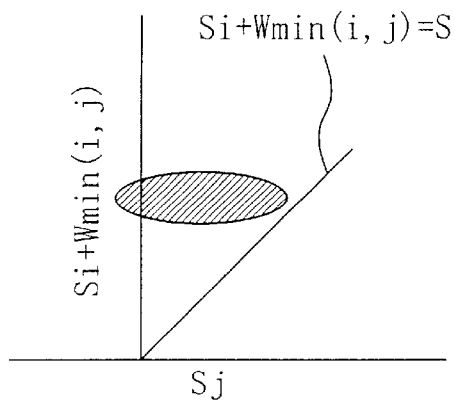
FIG. 3A  FIG. 3B
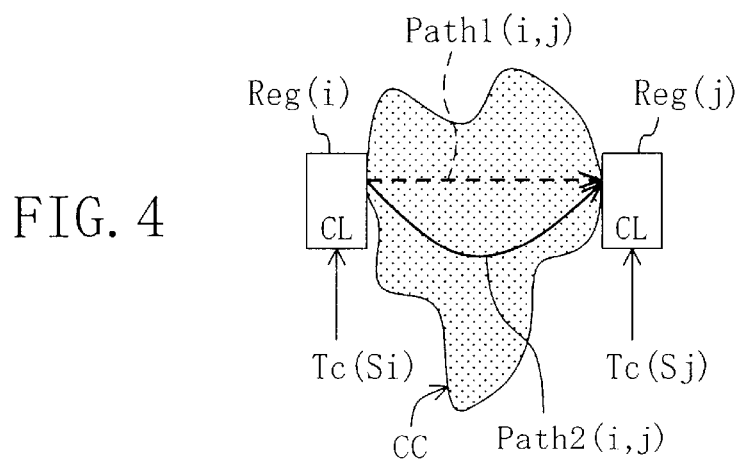
FIG. 4
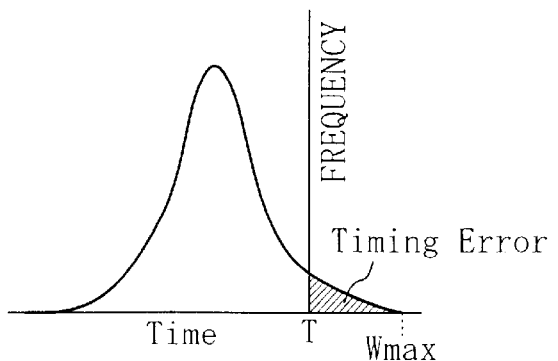
FIG. 5

DELAY ANALYSIS METHOD AND DESIGN ASSIST APPARATUS OF SEMICONDUCTOR CIRCUIT

BACKGROUND OF THE INVENTION

In recent years, with the adoption of microfabrication in semiconductor process technology, the rate of signal delay in relation to interconnections has increased. This has made it difficult to design timings to satisfy their specifications in design of semiconductor integrated circuits (LSI)

Conventionally, designers design and develop LSI circuits in the following manner. After a logic circuit design process with a logic synthesis tool and a layout design process with a layout tool, a designer performs timing analysis to examine whether or not an LSI circuit obtained through these processes satisfies the timings on the specifications. If the LSI circuit fails to satisfy the specifications, the designer determines that the layout design process should be repeated, or, in some instances, even determines that the design should be done again from the logic circuit design process.

FIG. 4 is a simplified illustration of the relation of timings in a part of LSI circuit design. Referring to FIG. 4, CC denotes a circuit portion to be analyzed, which includes a number of signal paths Path(i,j). Reg(i) and Reg(j) denote a start register and an end register, respectively, for the signal paths Path(i,j). Among propagation delays of a number of signal paths between the start register Reg(i) and the end register Reg(j), the minimum and maximum delay values are denoted by Wmin(i,j) and Wmax(i,j), respectively.

Suppose LSI design specifications include timing specifications satisfying a clock cycle T. In circuit design based on such specifications, if the maximum delay Wmax obtained after the circuit layout design fails to be shorter than the clock cycle T, it is impossible to complete data transfer through the signal path Path(i,j) within the clock cycle T. To avoid this trouble, conventionally, a delay analysis method as shown in FIG. 5 has been employed to analyze delays of signal paths. That is, a frequency distribution graph has been prepared for the maximum delays Wmax (i,j) of signal paths between all register pairs (i,j) of start and end registers, and generally used for delay analysis. This graph shows how the maximum delay Wmax is distributed and how an error is distributed with respect to the clock cycle T. As an example of such a system, Japanese Laid-Open Patent Publication No. 9-054138 discloses signal delay analysis by an interactive signal delay analysis method for semiconductor circuits, where the number of errors and the ratio thereof are presented in the form of a circle graph, and signal delay of a semiconductor circuit is analyzed based on the presented results.

Conventionally, designers have performed circuit design to satisfy targets on the design specifications using the frequency distribution graph. That is, when a majority of signal paths fail to satisfy the clock cycle T, the design method is reviewed starting from the logic circuit design process (major correction). When only a small number of signal paths fail to satisfy the clock cycle T, minute correction is made in the layout design process (minor correction).

The conventionally adopted frequency distribution graph or equivalent information thereof has the following problems. First, it fails to analyze the cause of a timing error generated by integration of a set-up error and clock delay. Secondly, it fails to analyze the cause of a timing error generated by integration of a hold error and clock delay. Thirdly, it fails to provide information essential for the current complicated design. For example, no design improvement indication is provided for a logic circuit section and a clock section.

SUMMARY OF THE INVENTION

An object of the present invention is facilitating analysis of the cause of a timing error generated by integration of a set-up error and clock delay and the cause of a timing error generated by integration of a hold error and clock delay, and also providing a design improvement indication for a logic circuit section and a clock section.

In facilitating the above analysis and providing a design improvement indication, if relevant information is output in the form of text files and the like, the information amount is enormous and thus it takes long time to perform timing analysis for satisfying the timing specifications. In view of this fact, another object of the present invention is providing a method for analyzing the cause of a timing error of an LSI circuit more intuitively and presenting the results suggesting measures to be taken, or an apparatus implementing the method.

In order to attain the above objects, according to the present invention, a general set-up condition or hold condition where clock delay is not 0 is presented on a two-dimensional graph.

The signal delay analysis method for a semiconductor circuit of the present invention includes the steps of: preparing a two-dimensional graph G defined by two axes of Si and Sj+T−Wmax or two axes of Sj and Si−T+Wmax where T is a clock cycle, Wmax is a maximum delay of a circuit portion to be analyzed, and Si and Sj are clock timings to registers to serve as an input and an output of the circuit portion; and plotting delay analysis results of the circuit portion on the two-dimensional graph G prepared in the preparing step.

According to the present invention, in the signal delay analysis method for a semiconductor circuit described above, in the preparing step, an auxiliary line of Si=Sj+T−Wmax or an auxiliary line of Sj=Si−T+Wmax drawn diagonally from the origin may be added to the two-dimensional graph G prepared.

Alternatively, the signal delay analysis method for a semiconductor circuit of the present invention includes the steps of: preparing a two-dimensional graph G defined by two axes of Si and Sj−Wmin or two axes of Sj and Si+Wmin where Wmin is a minimum delay of a circuit portion to be analyzed, and Si and Sj are clock timings to registers to serve as an input and an output of the circuit portion; and plotting delay analysis results of the circuit portion on the two-dimensional graph G prepared in the preparing step.

According to the present invention, in the signal delay analysis method for a semiconductor circuit described above, in the preparing step, an auxiliary line of Si=Sj−Wmin or an auxiliary line of Sj=Si+Wmin drawn diagonally from the origin may be added to the two-dimensional graph G prepared.

According to the present invention, in the signal delay analysis method for a semiconductor circuit, an indication of correcting the clock timing to the register may be displayed when the delay analysis results on the two-dimensional graph G expand in parallel with the axis Si or the axis Sj, and an indication of improving signal delay of the circuit portion may be displayed when the delay analysis results expand vertically to the axis Si or the axis Sj.

The design assist apparatus for a semiconductor circuit of the present invention includes: preparing means for preparing a two-dimensional graph G defined by two axes of Si and Sj+T−Wmax or two axes of Sj and Si−T+Wmax where T is a clock cycle, Wmax is a maximum delay of a circuit portion to be analyzed, and Si and Sj are clock timings to registers to serve as an input and an output of the circuit portion; plotting means for plotting delay analysis results of the circuit portion on the two-dimensional graph G prepared in the preparing means; and indication means for displaying an indication of correcting the clock timing to the register when the delay analysis results on the two-dimensional graph G expand in parallel with the axis Si or the axis Sj, while displaying an indication of improving signal delay of the circuit portion when the delay analysis results expand vertically to the axis Si or the axis Sj.

Alternatively, the design assist apparatus for a semiconductor circuit of the present invention includes: preparing means for preparing a two-dimensional graph G defined by two axes of Si and Sj−Wmin or two axes of Sj and Si+Wmin where Wmin is a minimum delay of a circuit portion to be analyzed, and Si and Sj are clock timings to registers to serve as an input and an output of the circuit portion; plotting means for plotting delay analysis results of the circuit portion on the two-dimensional graph G prepared in the preparing means; and indication means for displaying an indication of correcting the clock timing to the register when the delay analysis results on the two-dimensional graph G expand in parallel with the axis Si or the axis Sj, while displaying an indication of improving signal delay of the circuit portion when the delay analysis results expand vertically to the axis Si or the axis Sj.

Thus, according to the present invention, the necessary and sufficient conditional expression that should be satisfied to enable a semiconductor circuit to operate at a clock cycle T is presented in the form of a two-dimensional graph defined by two axes one of which is a clock timing. The delay analysis results of the circuit portion to be analyzed are plotted on the two-dimensional graph. This enables observation of how the clock timing varies. In addition, it is possible to easily determine whether the error is a set-up or hold error or a clock timing error.

Moreover, according to the present invention, the necessary and sufficient conditional expression is presented in the form of a two-dimensional graph defined by two axes one of which is a clock timing as described above. Therefore, when the delay analysis results are distributed vertically to the clock timing axis, it can be determined that the clock skew is small, and thus an indication of improving signal delay of the circuit portion can be provided. On the contrary, when the delay analysis results are distributed in parallel with the clock timing axis, it can be determined that the clock skew is large, and thus an indication of improving the clock circuit design can be provided.

BRIEF DESCRIPTION OF THE DRAWINGS

FIG. 3A is a view for description of hold error analysis by the delay analysis method for a semiconductor circuit of the same example, where the distribution is vertical to the x-axis, and FIG. 3B is a view for description of hold error analysis by the delay analysis method, where the distribution is horizontal to the x-axis.

FIG. 4 is a schematic view of a semiconductor circuit.

FIG. 5 is a view showing conventional timing analysis.

DESCRIPTION OF THE PREFERRED EMBODIMENTS

Figure 1A:
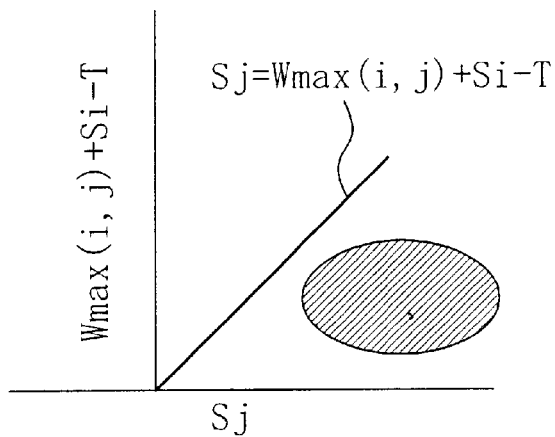
FIG. 1A is a view showing set-up error analysis by an example of the delay analysis method for a semiconductor circuit of the present invention.

Hereinafter, preferred examples of the delay analysis method and the design assist apparatus for a semiconductor circuit according to the present invention will be described with reference to the accompanying drawings.

Expressions 1 and 2 below are necessary and sufficient conditional expressions that should be satisfied to enable an LSI circuit (the circuit portion CC to be analyzed shown in FIG. 4) to operate at the clock cycle T.

$$Si-Sj<T-\text{Wmax}(i,j) \qquad \text{Expression 1}$$

$$Sj-Si<\text{Wmin}(i,j) \qquad \text{Expression 2}$$

The above expressions were derived by Fishburn (J. P. Fishburn, "Clock skew optimization", IEEE Trans. On Computers, Vol.39, pp.945–951, 1990). In these expressions, Si and Sj represent clock timings Cd1 and Cd2 supplied to the registers Reg(i) and Reg(j), respectively, expressed by delay values of clock signals (that is, deviations from target values). If the clock timings Cd1 and Cd2 are earlier than the target values, Si and Sj are negative values. If they are behind the target values, Si and Sj are positive values.

Expression 1 represents the timing condition (set-up condition) under which signal information can be captured into a register at a clock timing, while expression 2 represents the timing condition (hold condition) under which the next signal is avoided from entering during the capturing operation of the register. In the conventional design, as for the clock signal delay, Si=Sj, that is, 0 skew clock design has been regarded as a premise. Therefore, as the necessary and sufficient conditions, ones modified as follows have been taken into account.

$$\text{Wmax}(i,j) \leq T \qquad \text{Expression 3}$$

$$0 \leq \text{Wmin}(i,j) \qquad \text{Expression 4}$$

Expression 4 is always established because the minimum delay Wmin is never below 0. In the conventional design, expression 3 has been mainly considered as the condition for circuit design. With the clock delay being 0, there is no need to present timing analysis results involving a clock. This is the reason why only the analysis method as shown in FIG. 5 is conventionally employed for design.

The present invention proposes a method in which expressions 1 and 2 are presented as they are, to correspond to the general case that "clock delay is not 0", which has not been examined conventionally.

Specifically, expressions 1 and 2 are modified to expressions 5 and 6 below where one of the clock delays to the register, that is, Sj is centered, in a circuit to be analyzed.

$$Si-T+\text{Wmax}(i,j) \leq Sj \qquad \text{Expression 5}$$

$$Sj \leq \text{Wmin}(i,j)+Si \qquad \text{Expression 6}$$

Figure 1B:
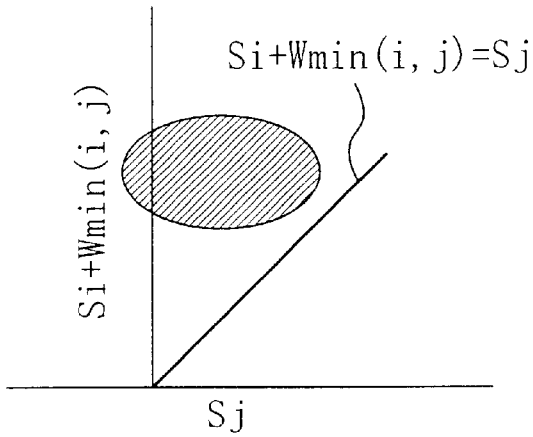
FIG. 1B is a view showing hold error analysis by the delay analysis method.

By the above modification, the necessary and sufficient conditions can be presented in the form of two-dimensional graphs G as shown in FIGS. 1A and 1B. In addition, diagonal lines are added to the respective two-dimensional graphs G shown in FIGS. 1A and 1B by drawing auxiliary lines of Sj=Si−T+Wmax(i,j) and Sj=Wmin(i,j)+Si, respectively.

On the thus-prepared two-dimensional graphs G, the delay analysis results of the circuit portion CC to be analyzed are plotted. Specifically, points represented by (x,y)=Sj,Si−T+Wmax(i,j)) are plotted on the graph G for each resister pair, and points represented by (x,y)=(Sj,Wmin(i,j)+Si) are plotted for each register pair.

Accordingly, the delay analysis method for a semiconductor circuit of this example enables the following analysis. First, in FIG. 1A, any distribution of plot points beyond the diagonal line will indicate a set-up error or an error of clock timing. Secondly, in FIG. 1B, any distribution of plot points beyond the diagonal line will indicate a hold error or an error of clock timing. Note that the region having plot points located on the left side of the axis of Sj=0 in FIG. 1B represents a set of plot points in which the clock timing Sj is earlier than the target value.

It is clear from expressions 5 and 6 that the above judgment is facilitated by using the two-dimensional graph G. Conventionally, there has been no idea of associating the necessary and sufficient condition for circuit operation with the timing error analysis. The present invention does not only simply graph the necessary and sufficient conditional expression, but advantageously uses the clock timing Cd (clock delay Sj) as the x-axis to thereby enable observation of the variation of the clock timing.

Another advantage of the delay analysis method of this example is that imperfection in the clock design can be easily distinguished from imperfection in the logic circuit design, so that an indication for circuit design can be provided. FIGS. 3A and 3B are views showing hold error analysis in this example. FIGS. 3A and 3B are different from each other in that the distribution expands in the direction vertical to the clock delay Sj (FIG. 3A) or parallel to the clock delay Sj (FIG. 3B). If 0 skew has been sufficiently attained in the clock design, the plotted points expand less widely with respect to the x-axis Sj, but expand vertically to the clock delay Sj as shown in FIG. 3A. When this is the case, signal delay of the logic circuit in the circuit portion CC must be improved. In reverse, when 0 skew design has not been controlled sufficiently well, the distribution expands in the direction horizontal to the clock delay Sj as shown in FIG. 3B. This indicates that the clock timing must be improved in the clock circuit design. In this way, by observing the distribution, it is possible to obtain suggestion or indication as to which measures should be taken, correction of the clock circuit or correction of the circuit portion CC.

Figure 2:
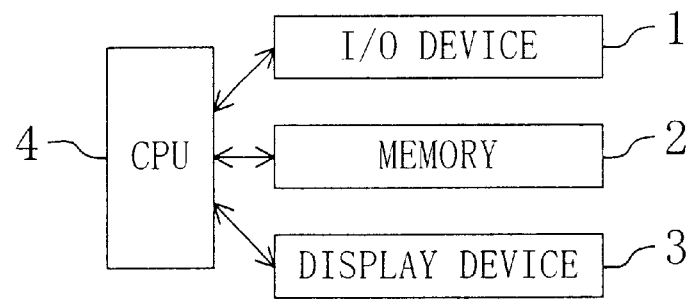
FIG. 2 is a view showing an example of the design assist apparatus for a semiconductor circuit of the present invention.

Next, FIG. 2 shows a timing analysis apparatus (design assist apparatus) having the function of presentation described above. In FIG. 2, circuit information and delay analysis results of the circuit portion CC are input into an I/O device 1 and then stored in a memory 2. A CPU 4 calculates the maximum delay Wmax and the minimum delay Wmin. The CPU 4 (preparing means) prepares the two-dimensional graphs G shown in FIGS. 1A and 1B. In addition, the CPU 4 (plotting means and indication means) plots the delay analysis results of the circuit portion CC stored in the memory 2 on the two-dimensional graphs G and displays the results on a display device 3, and also determines an indication for the improvement described above from the two-dimensional graphs G representing the delay analysis results of the circuit portion CC and displays the indication on the display device 3. The processing results by the CPU 4 are stored in the memory 2.

In the above description, expressions 1 and 2 were modified to expressions 5 and 6 by centering the clock delay Sj of the register Reg(j). Naturally, expressions 1 and 2 may be modified by centering the clock delay Si of the other register Reg(i). In this case, the auxiliary lines drawn on the two-dimensional graphs G are Si=Sj−T+Wmax(i,j) and Si=Wmin(i,j)+Sj.

In the above description, also, it should be noted that changes of the plus and minus signs and the x- and y-axes, as well as accompanying changes of distribution, are alterations that fall within the scope of the present invention.

Thus, according to the present invention, the necessary and sufficient conditional expression that should be satisfied to enable a semiconductor circuit to operate at a clock cycle T is presented in the form of a two-dimensional graph defined by two axes one of which is a clock timing. The delay analysis results of the circuit portion to be analyzed are plotted on the two-dimensional graph. This enables observation of how the clock timing varies. In addition, it is possible to easily determine intuitively whether the error is a set-up or hold error or a clock timing error.

Moreover, according to the present invention, it is possible to provide an indication as to whether the signal delay of the circuit portion analyzed should be improved, or clock circuit design should be improved.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A signal delay analysis method for a semiconductor circuit, comprising the steps of:

preparing a two-dimensional graph G defined by two axes of Si and Sj−Wmin or two axes of Sj and Si+Wmin where Wmin is a minimum delay of a circuit portion to be analyzed, and Si and Sj are clock timings to registers to serve as an input and an output of the circuit portion; and plotting delay analysis results of the circuit portion on the two-dimensional graph G prepared in the preparing step.

2. The signal delay analysis method for a semiconductor circuit of claim 1, wherein in the preparing step, an auxiliary line of Si=Sj−Wmin or an auxiliary line of Sj=Si+Wmin drawn diagonally from the origin is added to the two-dimensional graph G prepared.

3. The signal delay analysis method for a semiconductor circuit of claim 2, wherein, an indication of correcting the clock timing to the register is displayed when the delay analysis results on the two-dimensional graph G expand in parallel with the axis Si or the axis Sj, and an indication of improving of signal delay of the circuit portion is displayed when the delay analysis results expand vertically to the axis Si or the axis Sj.

4. The signal delay analysis method for a semiconductor circuit of claim 1, wherein, an indication of correcting the clock timing to the register is displayed when the delay analysis results on the two-dimensional graph G expand in parallel with the axis Si or the axis Sj, and an indication of improving signal delay of the circuit portion is displayed when the delay analysis results expand vertically to the axis Si or the axis Sj.

5. A design assist apparatus for a semiconductor circuit, comprising:

preparing means for preparing a two-dimensional graph G defined by two axes of Si and Sj−Wmin or two axes of Sj and Si+Wmin where Wmin is a minimum delay of a circuit portion to be analyzed, and Si and Sj are clock timings to registers to serve as an input and an output of the circuit portion;

plotting means for plotting delay analysis results of the circuit portion on the two-dimensional graph G prepared in the preparing means; and indication means for displaying an indication of correcting the clock timing to the register when the delay analysis results on the two-dimensional graph G expand in parallel with the axis Si or the axis Sj, while displaying an indication of improving signal delay of the circuit portion when the delay analysis results expand vertically to the axis Si or the axis Sj.

* * * * *